United States Patent
Chow et al.

(10) Patent No.: US 7,425,836 B2
(45) Date of Patent: Sep. 16, 2008

(54) MEASURING CHIP-TO-CHIP CAPACITANCE DIFFERENTIALS BY DEMODULATING SIGNALS OVER A CAPACITANCE BRIDGE

(75) Inventors: Alex Chow, East Palo Alto, CA (US); Robert D. Hopkins, Hayward, CA (US); Justin M. Schauer, Palo Alto, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 210 days.

(21) Appl. No.: 11/509,246

(22) Filed: Aug. 23, 2006

(65) Prior Publication Data

US 2008/0061801 A1 Mar. 13, 2008

(51) Int. Cl.
*G01R 27/26* (2006.01)

(52) U.S. Cl. ...................... 324/681; 324/686

(58) Field of Classification Search .......... 324/681, 324/686, 658, 679
See application file for complete search history.

(56) References Cited

U.S. PATENT DOCUMENTS 6,445,195 B1 * 9/2002 Ward ........................ 324/684

2006/0022861 A1 * 2/2006 Kudoh et al. ............... 341/155

* cited by examiner

*Primary Examiner*—Vincent Q Nguyen
(74) *Attorney, Agent, or Firm*—Park, Vaughan & Fleming LLP; Steven Stupp

(57) ABSTRACT

In a method for determining capacitance, a first time-varying signal is driven on a first terminal of a first capacitor and a second time-varying signal is driven on a first terminal of a second capacitor, where the first time-varying signal and the second time-varying signal have a pre-determined phase relationship with each other.

These signals are received on second terminals of the first capacitor and the second capacitor and demodulated using a periodic signal to produce demodulated signals. This periodic signal has the same fundamental frequency as the first time-varying signal and the second time-varying signal. A DC component in the demodulated signals is then determined by filtering the demodulated signals, and the sign of the DC component is used to determine a relative capacitance of the first capacitor and the second capacitor.

20 Claims, 13 Drawing Sheets

MEASURING CHIP-TO-CHIP CAPACITANCE DIFFERENTIALS BY DEMODULATING SIGNALS OVER A CAPACITANCE BRIDGE

GOVERNMENT LICENSE RIGHTS

This invention was made with United States Government support under Contract No. NBCH3039002 awarded by the Defense Advanced Research Projects Administration. The United States Government has certain rights in the invention.

BACKGROUND

1. Field of the Invention

The present invention relates to electronic circuits. More specifically, the present invention relates to the design of a capacitance-measurement circuit.

2. Related Art

Accurate capacitance models are typically used during the process of designing high-performance integrated circuits. Critical design parameters, such as the delay through logic circuits, the bandwidth of analog circuits, and the power required for cross-chip communication largely depend on wire and device capacitance. Capacitance models often include a combination of physical equations, 2-dimensional or 3-dimensional field simulations, and/or measured capacitances. Typically, physical equations and measured capacitances are only available for a limited set of capacitance geometries. Other geometries are typically modeled using field simulations, which are calibrated using the physical equations and measured capacitances. Hence, precise capacitance measurements can greatly improve the field simulation parameters and can thus provide more accurate capacitance models for high-performance circuit design.

More precise capacitance measurements can also improve the effectiveness of "proximity communication." In proximity communication, arrays of capacitive transmitters and receivers on semiconductor chips are used to provide inter-chip communication. When a first chip is situated face-to-face with a second chip, capacitive coupling between transmitter pads on the first chip and receiver pads on the second chip can be used to communicate signals between chips. However, to operate effectively capacitive coupling requires proper alignment between the transmitter pads and the receiver pads, both in a plane defined by the pads and in a direction perpendicular to the plane.

Misalignment between the transmitter pads and the receiver pads may cause each receiving pad to span two transmitting pads, thereby destroying a received signal. In theory, satisfactory communication requires alignment such that misalignment is less than half of a pitch between the pads. In practice, the alignment requirements may be more stringent. In addition, limiting overall misalignment may improve communication performance between the chips and reduce power consumption. Therefore, in order to correct for misalignment between chips, accurate measurements of coupling capacitances are often necessary.

Unfortunately, existing capacitance-measurement techniques often suffer from limited sensitivity. For example, many techniques involve precise measurements of very small currents, which is becoming increasingly difficult because of the large amounts of transistor leakage current that arise as circuit dimensions continue to decrease. These leakage currents may cause problems when measuring the capacitances of wires in integrated circuits, which may be extremely small due to submicron dimensions of modern integrated circuit processes.

For example, in a 90-nanometer technology a wire may be only 150 nanometers wide and may have a capacitance smaller than a femtoFarad (fF). In order to measure to two significant digits, an accurate measurement technique would, therefore, require an attoFarad (aF) resolution, which may exceed the capability of existing capacitance-measurement techniques.

Hence, what is needed, therefore, is a capacitance-measurement technique that overcomes the problems listed above.

SUMMARY

One embodiment of the present invention provides a method for determining capacitance. In the method, a first time-varying signal is driven on a first terminal of a first capacitor and a second time-varying signal is driven on a first terminal of a second capacitor, where the first time-varying signal and the second time-varying signal have a pre-determined phase relationship with each other. These signals are received on second terminals of the first capacitor and the second capacitor and are demodulated using a periodic signal to produce demodulated signals. Note that the periodic signal has a same fundamental frequency as the first time-varying signal and the second time-varying signal. A DC component in the demodulated signals is then determined by filtering the demodulated signals and a sign of the DC component determines a relative capacitance of the first capacitor and the second capacitor.

In some embodiments, the method further involves isolating the received signals using a unity gain buffer. Furthermore, in some embodiments the method further involves amplifying the received signals using a differential amplifier. Inputs to the differential amplifier may be biased to set a DC level of these inputs.

In some embodiments, the second terminals of the first capacitor and the second capacitor are a common terminal. The first capacitor and the second capacitor may correspond to proximity connectors that are proximate to surfaces of two semiconductor dies and are configured to communicate signals via capacitive coupling. In addition, the first terminals of the first capacitor and the second capacitor may be located on one of the two semiconductor dies and the common terminal of the first capacitor and the second capacitor may be located on the other semiconductor die.

In some embodiments, the method further involves determining alignment of the two semiconductor dies based on the DC component. Furthermore, in some embodiments the method further involves determining a phase of the periodic signal such that the DC component is approximately 0 when the first capacitor and the second capacitor have approximately equal capacitance.

In some embodiments, the second capacitor is a varactor. And in some embodiments, the pre-determined phase relationship includes approximately 180°.

In some embodiments, the method further involves sequentially driving time-varying signals on first terminals of a set of capacitors and selectively coupling to second terminals of the set of capacitors. Signals are then received on a second terminal of the first capacitor and a second terminal of at least one of the set of capacitors in order to determine a capacitance of the first capacitor using a binary search procedure.

In another embodiment, a device contains a first semiconductor die. This semiconductor die includes proximity connectors in a first array that is proximate to a surface of the first semiconductor die. A buffer circuit is coupled to at least a first proximity connector in the first array and a demodulator circuit coupled to the buffer circuit. The buffer circuit is configured to receive signals on at least the first proximity connector and the demodulator circuit is configured to demodulate the received signals to produce demodulated signals using the periodic signal having the same fundamental frequency as the fundamental frequency of the received signals. These received signals are capacitively coupled between the semiconductor die and another semiconductor die via two capacitors corresponding to at least the first proximity connector and proximity connectors on the other semiconductor die. Furthermore, a filter is coupled to the demodulator circuit, where the filter is configured to determine the DC component in the demodulated signals and a sign of the DC component determines the relative capacitance of the two capacitors.

In some embodiments, the device further contains a second semiconductor die. The second semiconductor die includes proximity connectors in a second array proximate to a surface of the second semiconductor die, and a drive circuit coupled to a second proximity connector and a third proximity connector in the second array. The drive circuit is configured to drive a first time-varying signal on the second proximity connector and a second time-varying signal on the third proximity connector. These time-varying signals have a pre-determined phase with respect to each other. In addition, the alignment of the first semiconductor die and the second semiconductor die may be determined based on the DC component.

In some embodiments, the first semiconductor die further includes a first selection circuit configured to selectively couple the buffer circuit to proximity connectors in the first array. And in some embodiments, the second semiconductor die further includes a second selection circuit configured to selectively couple the drive circuit to proximity connectors in the second array. Control logic in either or both of the semiconductor dies may be configured to control such selective coupling in order to determine a capacitance of at least one of the two capacitors using a binary search procedure.

In some embodiments, the first semiconductor die further includes a calibration circuit coupled to the demodulator circuit. This calibration circuit is configured to determine the phase of the periodic signal such that the DC component is approximately 0 when the two capacitors have approximately equal capacitance.

BRIEF DESCRIPTION OF THE FIGURES

Note that like reference numerals refer to corresponding parts throughout the drawings.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a method, a circuit, and devices and systems that include at least a portion of the circuit are described. In one embodiment of the method, a relative capacitance of two capacitors that capacitively couple proximity communication circuits on two semiconductor dies are determined. In this embodiment, time-varying signals having a pre-determined phase relationship, such as 180°, are transmitted using proximity circuits on one semiconductor die and are received using proximity circuits on another semiconductor die. These received signals are demodulated using a periodic signal, such as a sine-wave, a square-wave, or a pseudo-random signal, that has the same fundamental frequency as the fundamental frequency of the time-varying signals. Then, a DC component in the demodulated signal is determined using a filter, such as a low-pass filter. Next, the relative capacitance may be determined from the sign of the DC component. Note that this measurement technique is insensitive to transistor leakage and offset, and provides high measurement sensitivity and accuracy.

The magnitude of the capacitance of at least one of the capacitors may also be determined. For example, time-varying signals may be sequentially driven or transmitted on a set of capacitors. Next, the corresponding received signals may be selectively coupled to the circuit and the magnitude of at least one capacitor may be determined using a binary search procedure. Furthermore, alignment of the two semiconductor dies may be determined based on the DC component.

While the following embodiments illustrate the application of the method and circuit to determining coupling capacitances between proximity circuits on semiconductor dies, in other embodiments the capacitance measurement technique may be used in a variety of applications. For example, an unknown capacitance may be compared to a known capacitance (such as that provided by a varactor) using the circuit. Furthermore, a similar method and circuit may be sued to determine a degree of coupling for another electro-magnetic signal, including magnetic signals and/or optical signals.

Figure 1:
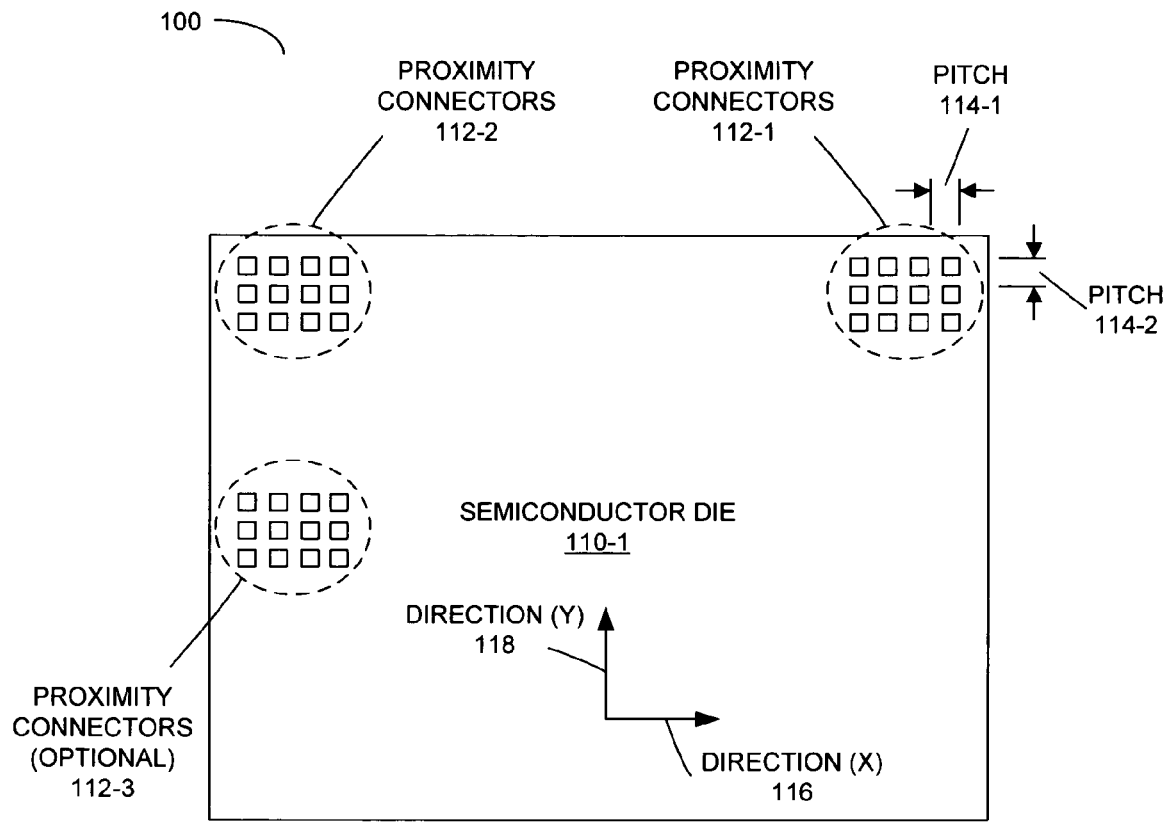
FIG. 1 is a block diagram illustrating a device that includes proximity connectors in accordance with an embodiment of the present invention.

We now described embodiments of devices and systems that include proximity communication. FIG. 1 presents a block diagram illustrating a device 100 that includes proximity connectors or pads 112 in accordance with an embodiment of the present invention. Device 100 may include at least one semiconductor die 110, wherein semiconductor die 110 may include integrated circuit electronics corresponding to layers deposited on a semiconductor substrate. Note that semiconductor die 110 may be packaged in a single-chip module (SCM) and/or a multi-chip module (MCM), where the MCM may include two or more SCMs. When packaged, for example in the SCM or the MCM, the one semiconductor die 110 is sometimes referred to as a "chip."

In one embodiment, the proximity connectors 112 may be on or proximate to at least one surface of the semiconductor die 110, the SCM and/or the MCM. In other embodiments, the semiconductor die 110, the SCM and/or the MCM may be coupled to the proximity connectors 112. In an exemplary embodiment, arrays of proximity connectors 112 are substantially located at or near one or more corners (proximity connectors 112-1 and 112-2) and/or edges (proximity connectors 112-3) of the semiconductor die 110. In other embodiments, proximity connectors 112 may be situated at one or more arbitrary locations on, or proximate to, the surface of the semiconductor die 110.

As illustrated for the proximity connectors 112-1, there is a first pitch 114-1 between adjacent connectors or pads in a first direction (X) 116 of the surface and a second pitch 114-2 between adjacent connectors or pads in a second direction (Y) 118 of the surface. In some embodiments, the first pitch 114-1 and the second pitch 114-2 are approximately equal.

Figure 2:
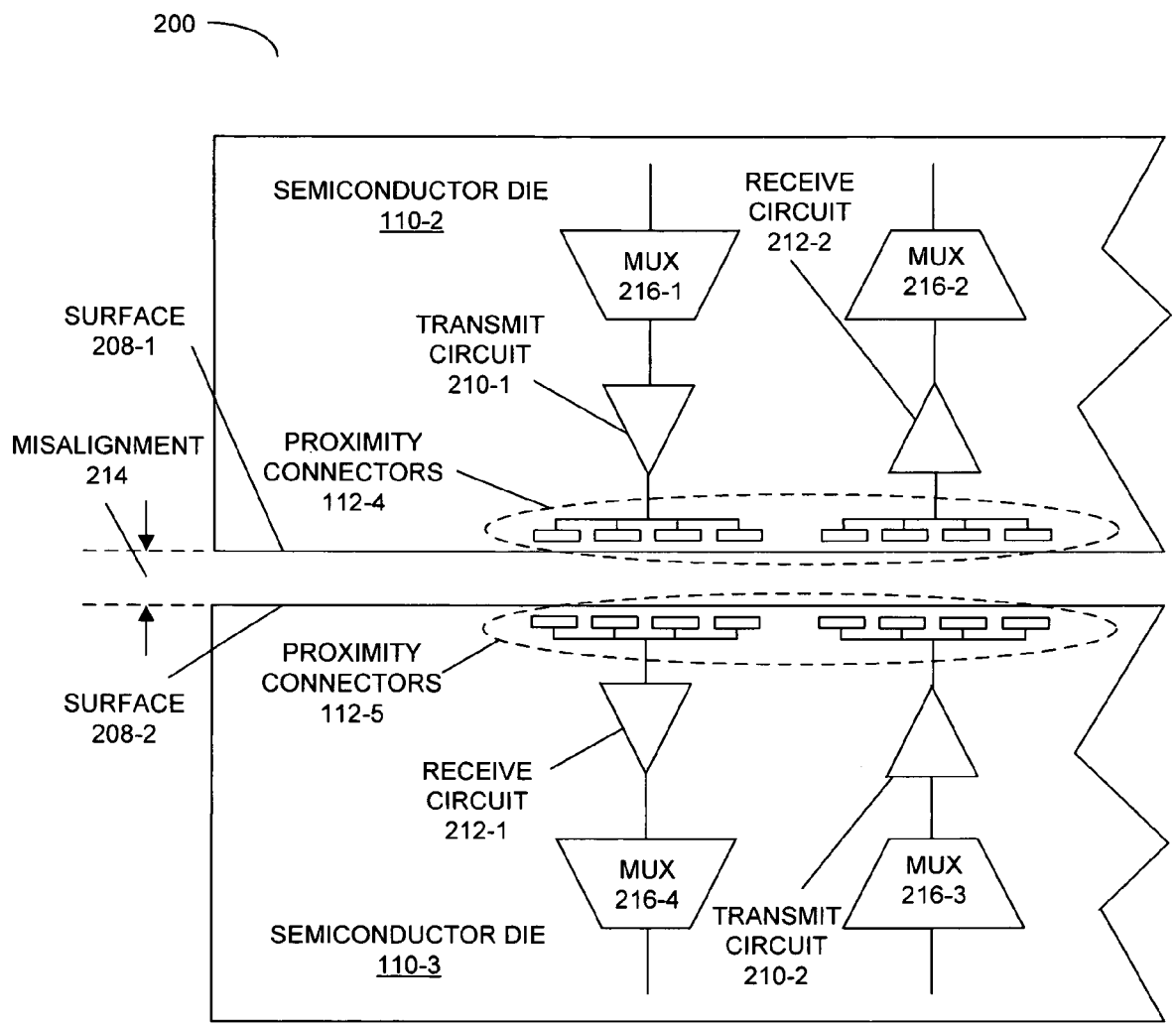
FIG. 2 is a block diagram illustrating a system that includes semiconductor dies that communicate using proximity communication in accordance with an embodiment of the present invention.

FIG. 2 presents a block diagram illustrating a system 200 that includes semiconductor dies 110 that communicate using proximity communication in accordance with an embodiment of the present invention. The devices 110 may include proximity connectors 112 that are on or proximate to surfaces 208 of the semiconductor dies 110. For example, the plurality of proximity connectors 112 may be situated beneath protective layers such that they are located below the surfaces 208. Moreover, subsets of the proximity connectors 112 may be coupled to transmit circuits 210 (such as transmit drivers) and receive circuits 212 (such as receivers). A communication channel may be comprised of one of the transmit circuits 210, at least a subset of the proximity connectors 112 on the adjacent semiconductor dies 110, and one of the receive circuits 212. For example, the communication channel may include transmit circuit 210-1, some of the proximity connectors 112, and receive circuit 212-1. Note that transmit circuits 210 and receive circuits 212 may utilize current-mode signaling (i.e., current-mode drivers and receivers) and/or voltage-mode signaling (i.e., voltage-mode drivers and receivers). Furthermore, semiconductor dies 110 may also include wiring and electronics (not shown) to relay the signals to additional circuits on the semiconductor dies 110, such as logic and memory.

In order to communicate signals using proximity communication, transmit and receive proximity connectors 112 on adjacent semiconductor dies 110 can tolerate only a limited misalignment. For densely packed proximity connectors, i.e., proximity connectors 112 having a small spacing or pitch 114 (FIG. 1) between adjacent pads, the alignment between two or more proximity connectors 112 on adjacent semiconductor dies 110 may be within a few microns in the first direction (X) 116 (FIG. 1) in a first plane including at least some of the proximity connectors 112, a few microns in the second direction (Y) 118 (FIG. 1) in the first plane, and/or within a few microns in a third direction (Z) approximately perpendicular to the first plane. The system 200 illustrates a separation or misalignment 214 in the third direction (Z).

In some embodiments, the proximity connectors 112 may be aligned in six degrees of freedom, including the first direction (X) 116 (FIG. 1), the second direction (Y) 118 (FIG. 1), the third direction (Z), a rotation angle in the first plane defined by the first direction (X) 116 (FIG. 1) and the second direction (Y) 118 (FIG. 1), a tilt angle in a second plane defined by the first direction (X) 116 (FIG. 1) and the third direction (Z), and a tilt angle in a third plane defined by the second direction (Y) 118 (FIG. 1) and the third direction (Z). Note that if a surface, such as the surface 208-1, of either of the adjacent semiconductor dies 110 is non-planar (for example, due to quadrupole distortion), additional alignment problems may be introduced.

In some embodiments, the allowed misalignment in the first direction (X) 116 (FIG. 1), the second direction (Y) 118 (FIG. 1) and/or the third direction (Z) is less than one half of the pitch 114 (FIG. 1) between adjacent proximity connectors 112. For example, misalignment in the first direction (X) 116 (FIG. 1) and/or the second direction (Y) 118 (FIG. 1) may be less than 25 μm, and the misalignment 214 in the third direction (Z) may be less than 5 μm.

Solutions, such as self-alignment and/or self-adjustment of relative positions of the proximity connectors 112 on adjacent semiconductor dies 110 and/or in a component coupling two or more semiconductor dies 110, may reduce and/or eliminate the misalignment 214 in the third direction (Z). For example, structures that have flexibility compliance or are spring-like may be used. In other embodiments, a feedback control loop may be used to reduce and/or eliminate the misalignment 214 in the third direction (Z).

Reducing or eliminating the misalignment 214, in turn, may lead to at least partial overlap of one or more proximity connectors 112 on the adjacent semiconductor dies 110 and increase a magnitude of the capacitively coupled data signals. In addition, the solutions may reduce misalignment in the first plane, i.e., the plane including at least some of the proximity connectors 112, when used in conjunction with techniques such as electronic steering, in which data signals are routed to given proximity connectors 112 based on the alignment in the first plane. (Note that steering mechanisms, such as multiplexers 216, may be included in or proximate to the arrays of proximity connectors 112 in order to facilitate such electronic steering in one or more of the semiconductor dies 110). As a consequence, these solutions may facilitate proximity communication between the semiconductor dies 110, SCMs and/or MCMs. The solutions may also reduce and/or eliminate a need for narrow tolerances, precise manufacturing, and/or precise assembly of the semiconductor dies 110, the SCM and/or the MCM.

In the embodiments described above and below, the proximity connectors 112 on the adjacent semiconductor dies 110 utilize capacitive coupling and/or a number of data signal channels for inter-chip communication. In other embodiments, additional connectors may be overlapped on adjacent semiconductor dies 110.

While the description below uses capacitively coupled proximity connectors as an illustration, one embodiment of the present invention uses magnetic proximity connectors, where data signals are communicated magnetically between terminals on closely adjacent semiconductor dies 110. Another embodiment uses optical proximity connectors, where data signals are communicated optically between terminals (which may include optical emitters, detectors, and/or gratings) on adjacent semiconductor dies 110. Yet another embodiment couples connectors in adjacent semiconductor dies 110 using an array of solder balls.

While the device 100 (FIG. 1) and the system 200 are illustrated as having a number of components in a given configuration, in other embodiments the device 100 (FIG. 1) and/or the system 200 may include fewer components or additional components, two or more components may be combined into a single component, and/or a position of one or more components may be changed.

We now describe embodiments of circuits configured to determine capacitance. In the context of proximity communication, misalignment between semiconductor dies may be determined from the coupling capacitance between proximity connectors on these semiconductor dies. As discussed previously, the ability to measure the misalignment often enables techniques to reduce such misalignment and/or to mitigate its effects (using techniques such as electronic steering) thereby enabling proximity communication between the semiconductor dies. While the misalignment in all six degrees of freedom may be determined, in some embodiments the techniques are combined with other measurement techniques (as described below with reference to FIG. 9). For example, the capacitance measurement technique may be used to determine misalignment in the first direction (X) 116 (FIG. 1), the second direction (Y) 118 (FIG. 1), and an angle in the first plane defined by the first direction (X) 116 (FIG. 1) and the second direction (Y) 118 (FIG. 1) (which is also referred to as the in-plane rotation angle).

Figure 3:
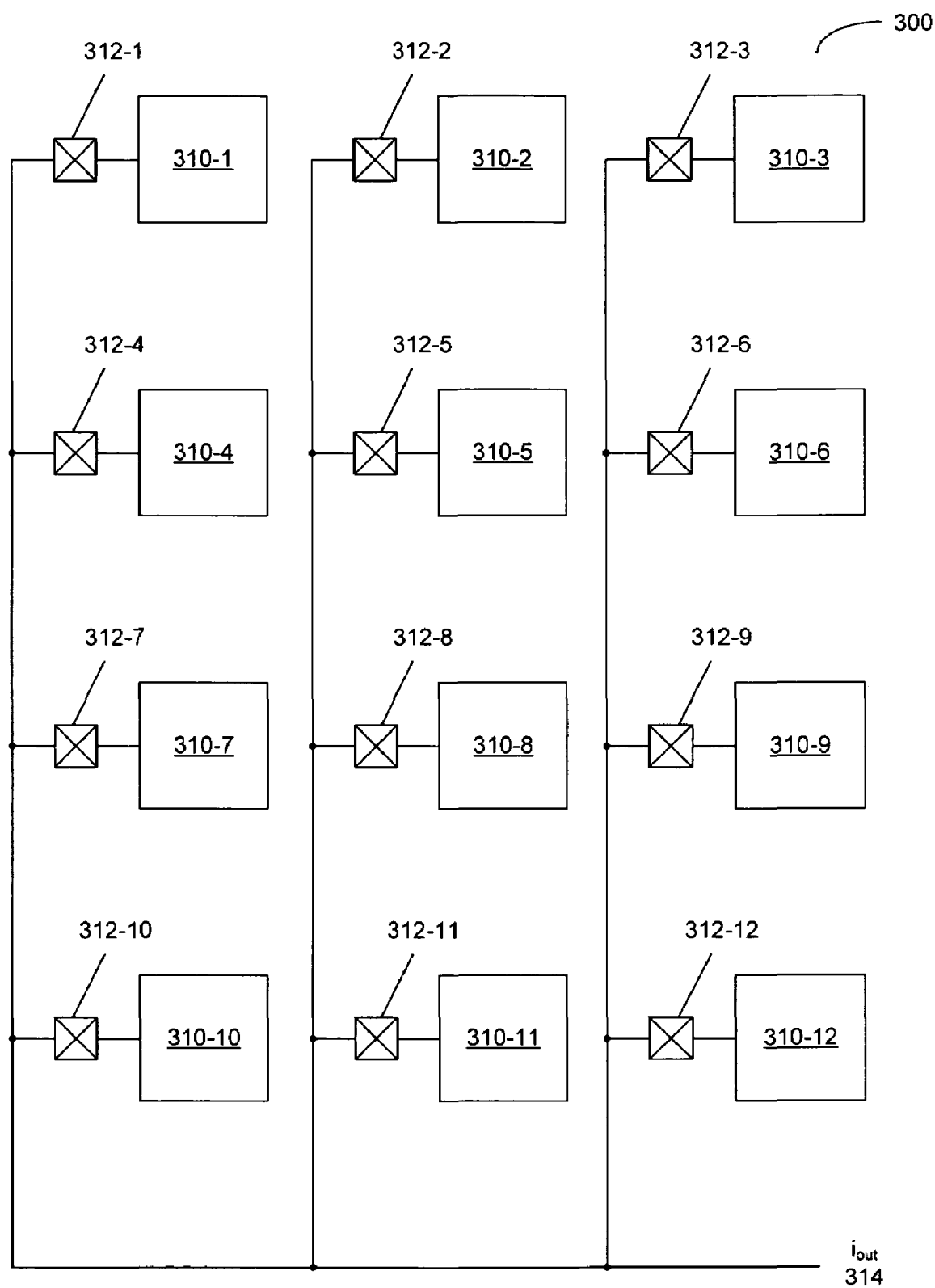
FIG. 3 is a block diagram illustrating an array of proximity connectors in accordance with an embodiment of the present invention.
Figure 4A:
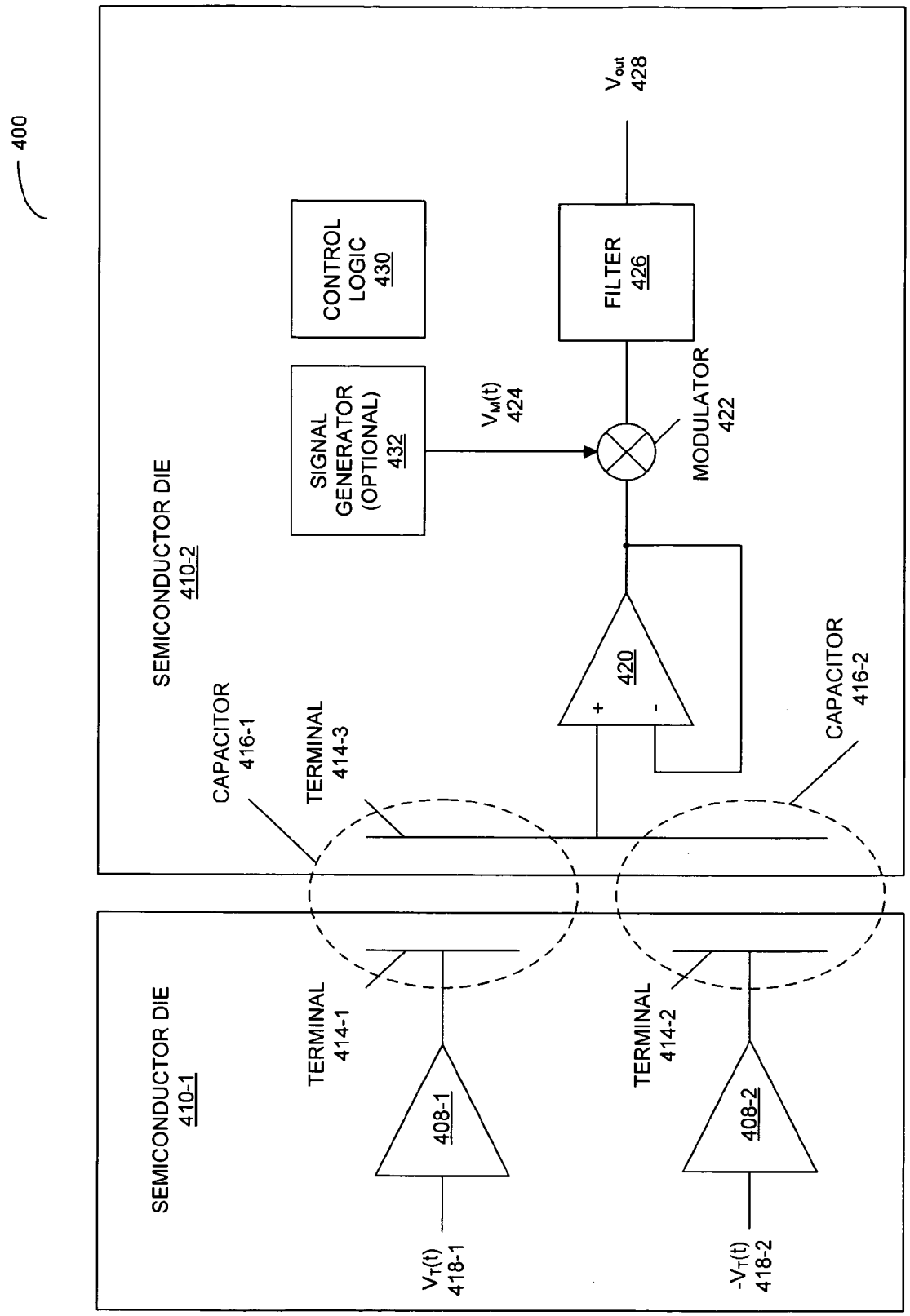
FIG. 4A is a block diagram illustrating a capacitance measurement circuit in accordance with an embodiment of the present invention.
Figure 4B:
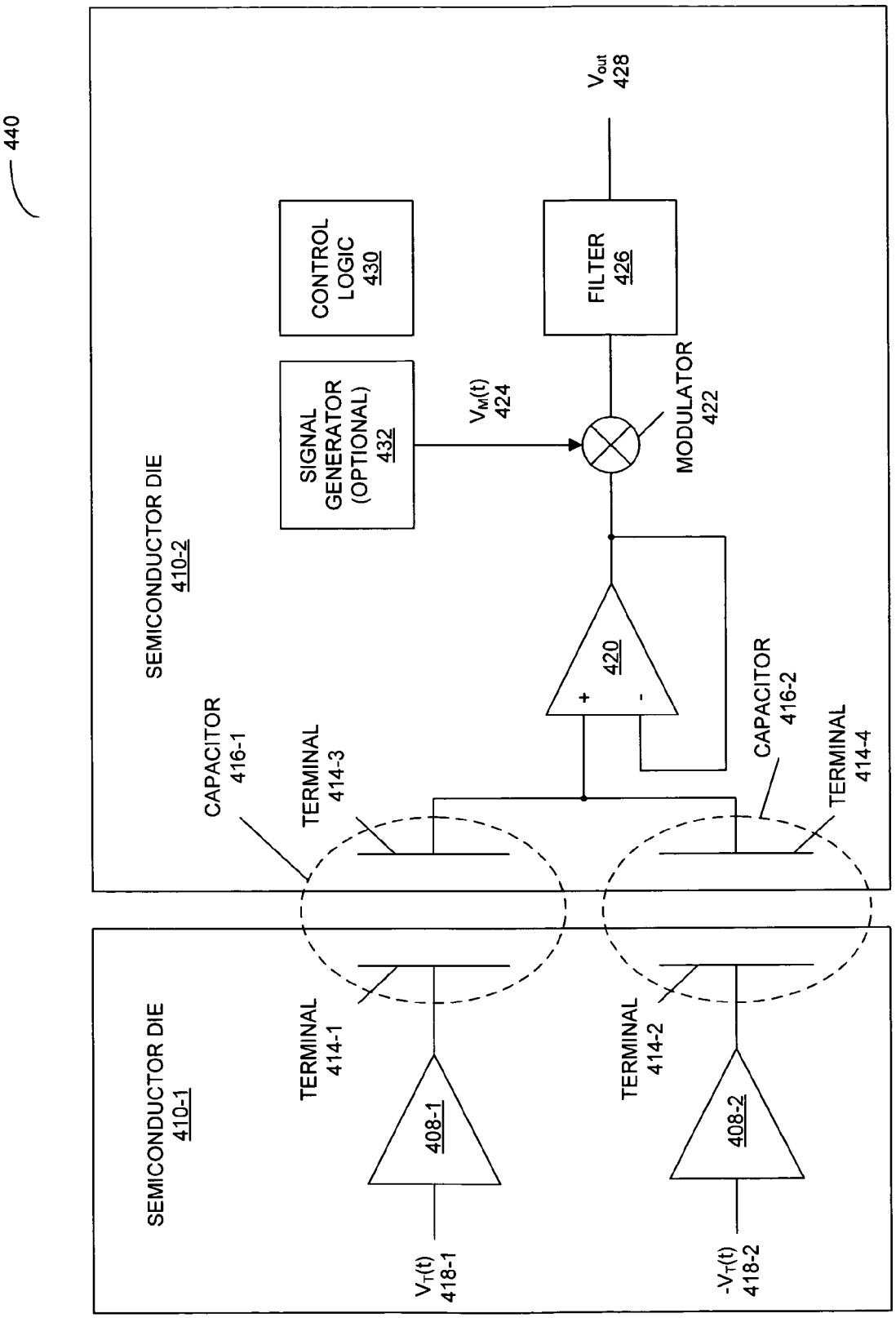
FIG. 4B is a block diagram illustrating a capacitance measurement circuit in accordance with an embodiment of the present invention.
Figure 4C:
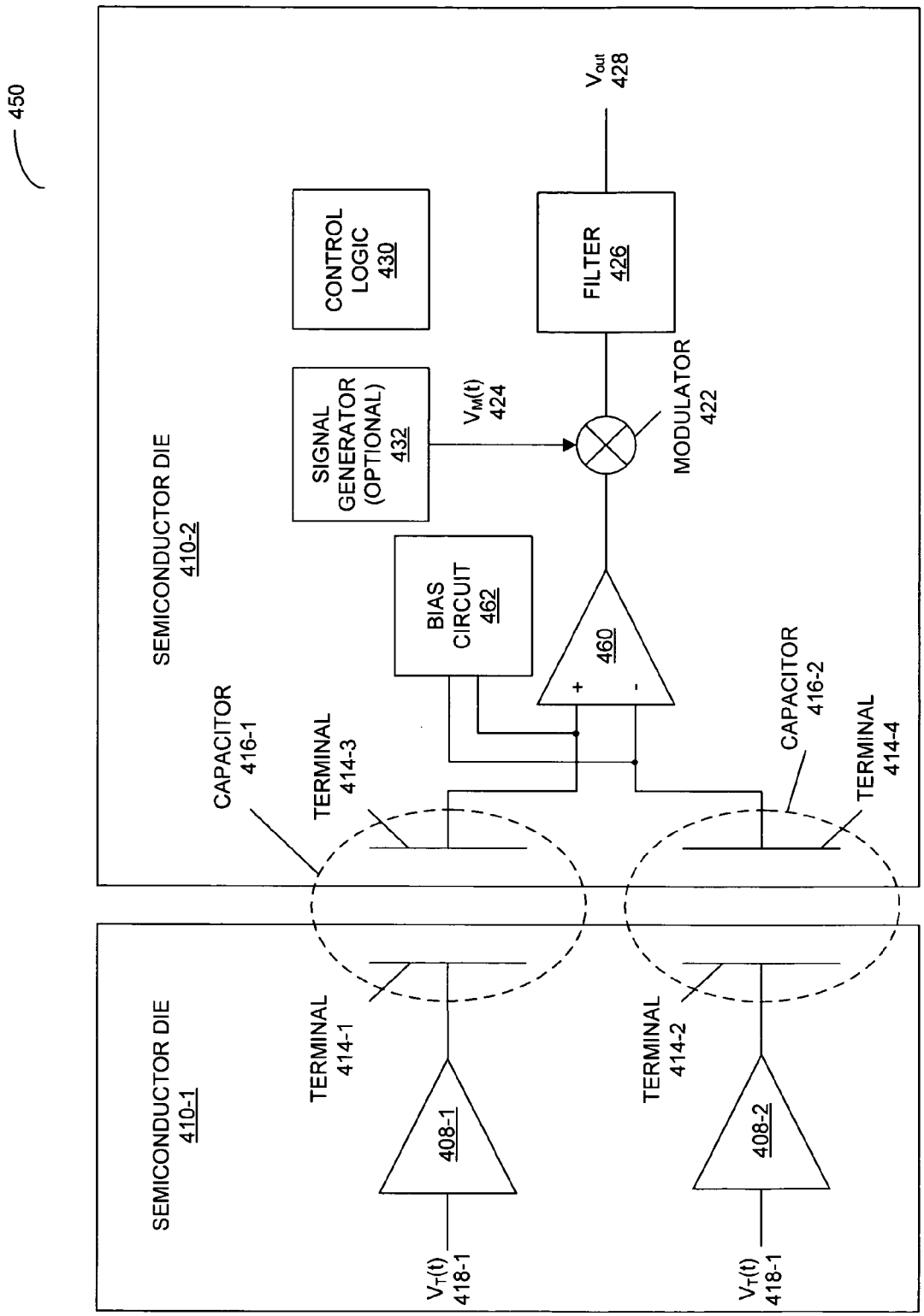
FIG. 4C is a block diagram illustrating a capacitance measurement circuit in accordance with an embodiment of the present invention.
Figure 4D:
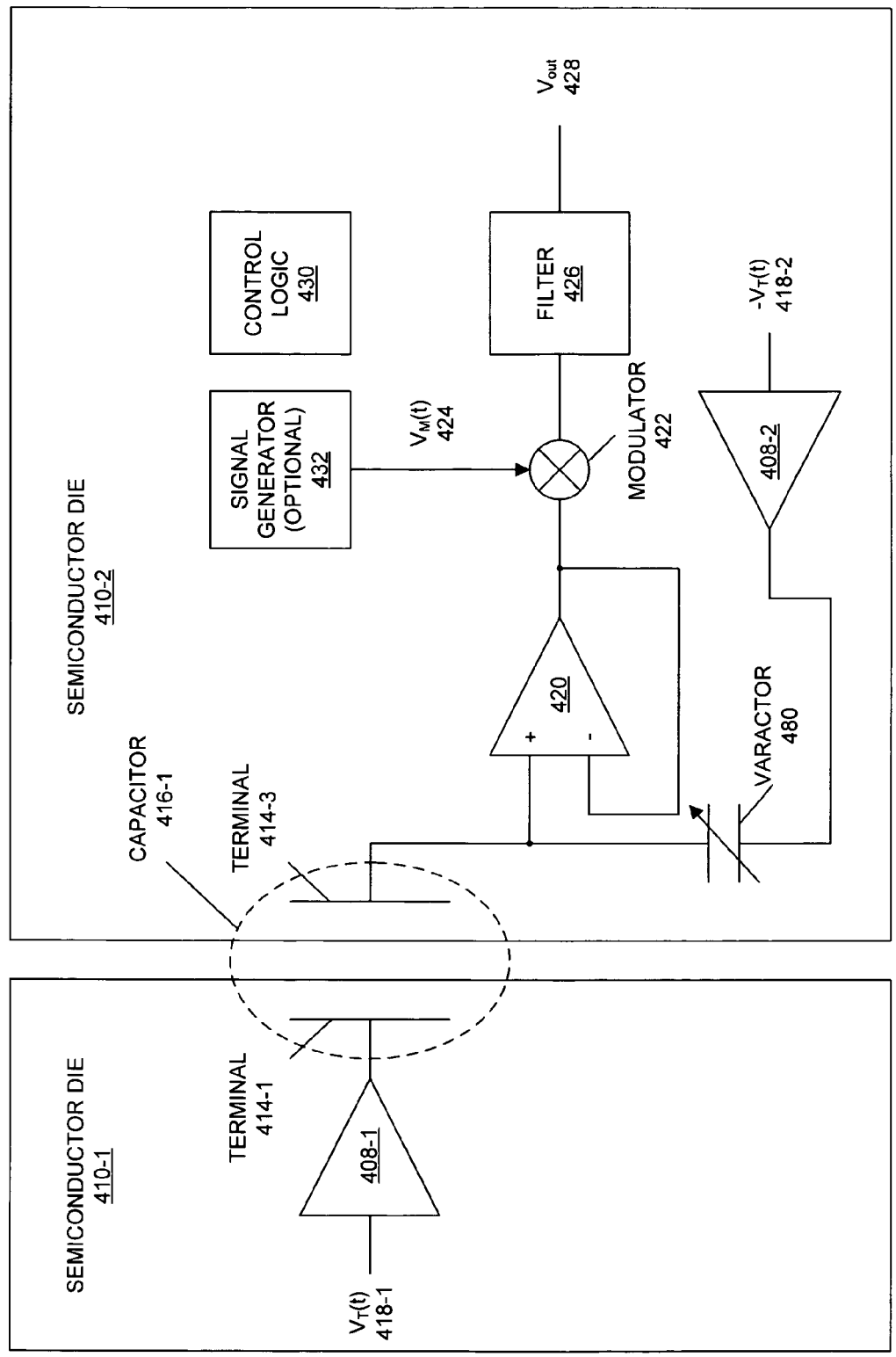
FIG. 4D is a block diagram illustrating a capacitance measurement circuit in accordance with an embodiment of the present invention.

An array of proximity connectors is often used to determine the misalignment. By activating and measuring the coupling capacitance between proximity connectors at different locations in the array, the separation, tilt, in-plane misalignment, and in-plane rotation angle may be determined. As illustrated in FIG. 3, which provides a block diagram illustrating an array 300 of proximity connectors 310 on a receiving semiconductor die in accordance with an embodiment of the present invention, switches 312 activate or deactivate a given proximity connector, such as proximity connector 310-5. For example, switch 312-5 may be a pass-gate that either passes or blocks current that is transferred onto proximity connector 310-5 by its corresponding proximity connector on the transmitting semiconductor die.

However, many existing techniques for determining the coupling capacitance between these proximity connectors measure an average current ($i_{out}$) 314 that is transferred. This current is normally very small. For example, for a typical pad size of 100 μm² with a 90 nm process, the maximum coupling capacitance is 1.3 fF and the voltage swing (ΔV) is limited to 1V. Using a typical measurement frequency of 100 kHz, the average current ($i_{out}$) 314 is less than 1.3 nA. Unfortunately, leakage currents from the transistors in the switches 312 (due to effects such as sub-threshold leakage and gate leakage) may limit the accuracy of the measurements due to the small average current ($i_{out}$) 314 available.

This problem is expected to become significantly worse as newer fabrication technologies are used. For example, in a 180 nm process sub-threshold leakage of a deactivated pass-gate at 75 C is 68 pA/μm, and in a 90 nm process it becomes a prohibitive 9.1 nA/μm. For a minimum-size pass-gate, leakage is over 2 nA per proximity connector. Even for a small 20×20 array, the average current ($i_{out}$) 314 for a single proximity connector (1.3 nA) is very small relative to the leakage current from the other 399 proximity connectors (800 nA). Moreover, gate leakage only further compounds this challenge (in the 65 nm process, gate leakage in an activated pass-gate approaches 300 pA/μm). Note that leakage current is also very dependent on temperature. Therefore, noise due to leakage may vary over time and may be difficult to filter or removed during calibration.

The embodiments of the circuit and method described below address these challenges by measuring differences in coupling capacitance between semiconductor dies by demodulating signals communicated across a capacitive bridge between the two semiconductor dies. As noted previously, this approach is insensitive to transistor leakage and offset.

FIGS. 4A-4D provide block diagram illustrating a capacitance measurement circuit in accordance with embodiments 400, 440, 450, and 470 of the present invention. Embodiment 400 is described in detail as an illustration of the features that may occur in one or more of the embodiments 400, 440, 450, and 470. The differences between the remaining embodiments and embodiment 400 are then described.

In embodiment 400, driver or transmitter circuits 408 in semiconductor die 410-1 apply time-varying signals $V_T(t)$ 418-1 and $-V_T(t)$ 418-2, which each have a same fundamental frequency, to corresponding terminals 414-1 and 414-2 of capacitors 416. Note that while the time-varying signals $V_T(t)$ 418-1 and $-V_T(t)$ 418-2 are illustrated as having a phase of approximately 180° with respect to one another, in other embodiments the phase may have a different value. Furthermore, in some embodiments the time-varying signals $V_T(t)$ 418-1 and $-V_T(t)$ 418-2 may have different amplitudes. In general, the phase between the time-varying signals $V_T(t)$ 418-1 and $-V_T(t)$ 418-2 has an arbitrary value and is fixed. Also note that capacitors 416 correspond to the coupling capacitance between proximity connectors on semiconductor dies 410-1 and 410-2. The proximity connectors may be at different locations on a given semiconductor die. In embodiment 400, terminal 414-3 is common to the capacitors 416 (for example, it may correspond to a proximity connector that is common to both of the capacitors 416). However, in other embodiments (such as embodiments 440 and 450) there may be separate terminals 414-3 and 414-4 for the second terminal in these capacitors 416.

Signals that are received on the terminal 414-3 are coupled to a follower or buffer 420. In an exemplary embodiment, the buffer 420 has unity gain. However, in other embodiments (such as embodiment 450) a differential amplifier or a variable-gain amplifier (for example, with a gain approximately between 3 and 10) may be used. The received signals are then coupled to mixer or modulator 422 in which they are demodulated using modulation signal $V_M(t)$ 424. In some embodiments, the signal $V_M(t)$ 424 is generated by optional signal generator 432 or is provided by a signal generator that is external to the semiconductor die 410-2. The signal $V_M(t)$ 424 is periodic and has a fundamental frequency that is the same as the fundamental frequency of the time-varying signals $V_T(t)$ 418-1 and $-V_T(t)$ 418-2. In exemplary embodiments, the fundamental frequency is between 1 kHz and 3 MHz, and the signal $V_M(t)$ 424 is a sine-wave signal, a square-wave signal, or a pseudo-random signal. Demodulation using a sine-wave signal is illustrated below with reference to FIGS. 5A-5C.

The demodulated signal output from the modulator 422 is filtered using filter 426, whose output $V_{out}$ 428 is a DC component of the demodulated signal. A sign of this output $V_{out}$ 428 corresponds to the relative capacitance of capacitors 416, i.e., it indicates which of the capacitors 416 is larger. Note that this measurement technique depends on the phase of the received signals. In particular, an offset in the phase gives rise to an offset in the output $V_{out}$ 428, and thus in the relative capacitance. Therefore, in some embodiments a calibration circuit (for example, in the optional signal generator 432) may adjust the phase of the signal $V_M(t)$ 424 such that $V_{out}$ 428 equals 0 when the capacitances of the capacitors 416 are equal. This procedure may be performed during a calibration mode of operation.

In other embodiments, the capacitance of at least one of the capacitors 416 (such as the capacitor 416-1) is determined using an array of reference capacitors. Capacitor 416-1 is compared, one by one, to a sequence of the reference capacitors using the detection circuit in semiconductor die 410-2. The various reference capacitors are coupled to the drive circuit 418-2 using a switching mechanism (such as multiplexer 216-1 in FIG. 2), and to the detection circuit using another switching mechanism (such as multiplexer 216-4 in FIG. 2). The sequence of reference capacitors may correspond to a binary search procedure that allows the unknown capacitance to be determined. The switching process and the selection of the sequence of reference capacitors may be controlled using control logic 430. However, in other embodiments the control logic 430 is located in the semiconductor die 410-1 or there is additional control logic in the semiconductor die 410-1. Furthermore, in other embodiments there are multiple instances of at least a portion of the detection circuit that are connected to corresponding proximity connectors. This approach may replace the switching mechanism in the semiconductor die 410-2.

While the embodiment 400 illustrates a given configuration, in other embodiments at least a portion of the circuitry may be implemented on a separate Application Specific Integrated Circuit (ASIC), Field Programmable Gate Array (FPGA), or on another circuit board. Furthermore, in some embodiments, at least a portion of the detection circuit (such as the modulator 422 and/or the filter 426) may be implemented using Digital Signal Processing (DSP). Note that if the buffer 420 or amplification is implemented external to the semiconductor die 410-2 (i.e., off-chip), integration over multiple periods corresponding to the fundamental frequency of the time-varying signals $V_T(t)$ 418-1 and $-V_T(t)$ 418-2 may be used to improve the signal-to-noise ratio.

In addition, while embodiment 400, and embodiments 440, 450, and 470, is illustrated as having a number of components in a given configuration, other embodiments may include fewer components or additional components, two or more components may be combined into a single component, and/or a position of one or more components may be changed. For example, the detection circuit may use a heterodyned receiver that demodulates the received signals to an intermediate frequency prior to demodulating to baseband.

As discussed above, embodiment 440 illustrates the capacitors 416 with separate terminals 414-3 and 414-4. Embodiment 450 illustrates the use of a differential amplifier 460. In this embodiment, the drive circuits 408 apply the same time-varying signal $V_T(t)$ 418-1 to the terminals 414-1 and 414-2 (thus, the phase between these signals in this embodiment is 0°). As discussed previously, this measurement technique for determining the capacitance depends on the phase of the received signals. As a consequence, inputs to the differential amplifier 460 may be DC balanced, for example, using bias circuit 462.

Embodiment 470 illustrates another variation of this measurement technique. The capacitor 416-2 has been replaced by a varactor 480, which has a voltage-controlled variable capacitance. By sequentially varying the capacitance of the varactor 480, the magnitude of the capacitance of the capacitor 416-1 may be determined. Note that in an alternate embodiment an off-chip capacitor may be used as a reference capacitor. This off-chip capacitor may be used in conjunction with or independently of the varactor 480.

We now discuss the theory underlying the capacitance measurement technique. For a phase of 180° between the time-varying signals $V_T(t)$ 418-1 and $-V_T(t)$ 418-2, the received signal $V_R(t)$ is $$\frac{C_1 - C_2}{C_1 + C_2 + C_p} V_T(t) = C_d V_T(t),$$

where $C_1$ is the capacitance of the capacitor 416-1, $C_2$ is the capacitance of the capacitor 416-2, $C_p$ represents all of the parasitic capacitances in the detection circuit on the semiconductor die 410-2, and $C_d$ is the difference in the coupling capacitances relative to the total capacitance on the receiving node(s) or proximity connector(s). Note that the sign of $V_R(t)$ is proportional to $C_1-C_2$. Therefore, we can compare two coupling capacitances at two different locations by determining the sign of $V_R(t)$.

However, since it is difficult in practice to extract the peak values of $V_R(t)$, the output from the buffer 420 (which is proportional to $V_R(t)$) is demodulated to extract the DC component. Assuming $V_T(t)$ is a sinusoidal signal with a frequency $\omega$, $V_R(t)$ is $$C_d \sin(\omega t).$$

Furthermore, assuming that the modulation signal $V_M(t)$ 424 is a sinusoidal signal with a frequency $\omega$, and that $V_M(t)$ 424 is phase coherent with $V_R(t)$, the demodulated signal is $$V_M(t) \cdot V_R(t) = C_d \sin^2(\omega t) = \frac{C_d}{2} - \frac{C_d}{2} \cos(2\omega t), \quad (1)$$

which has two frequency components, one at DC and one $2\omega t$. Filtering, for example with a low-pass filter, allows the DC component ($C_d/2$) to be measured.

Figure 5A:
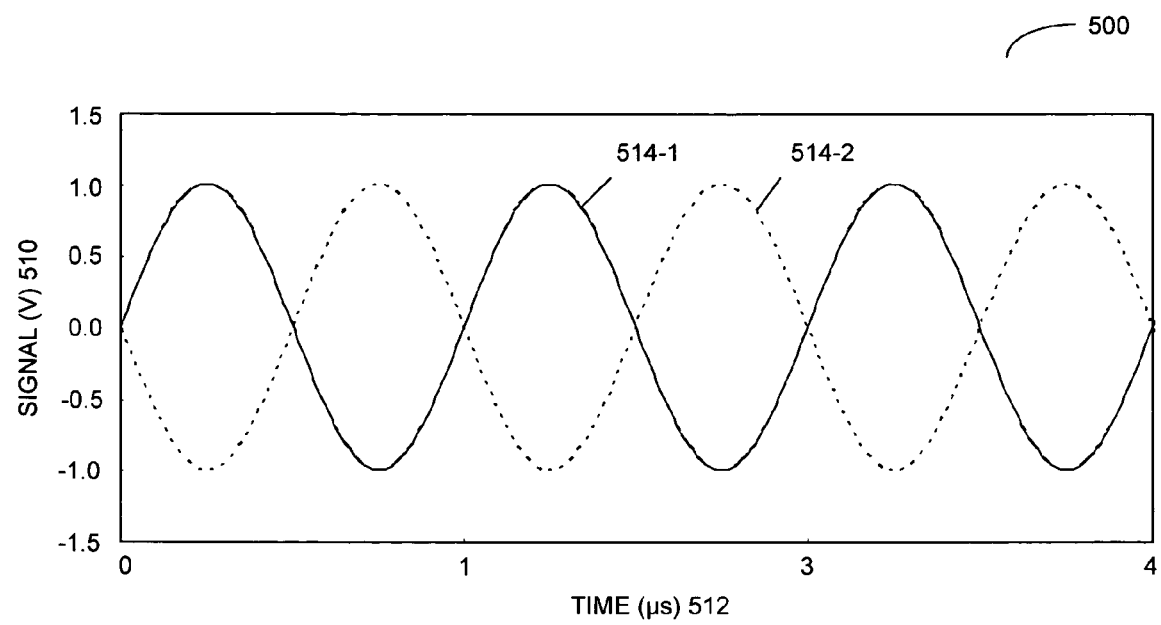
FIG. 5A is a block diagram illustrating simulated transmit signals in accordance with an embodiment of the present invention.
Figure 5B:
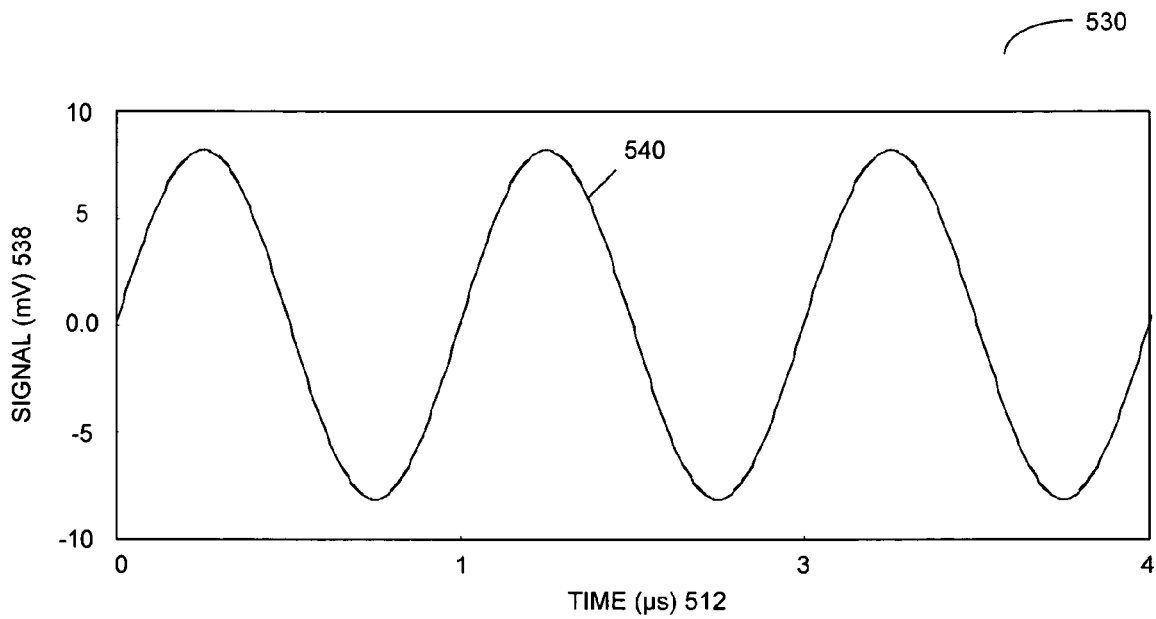
FIG. 5B is a block diagram illustrating a simulated receive signal in accordance with an embodiment of the present invention.
Figure 5C:
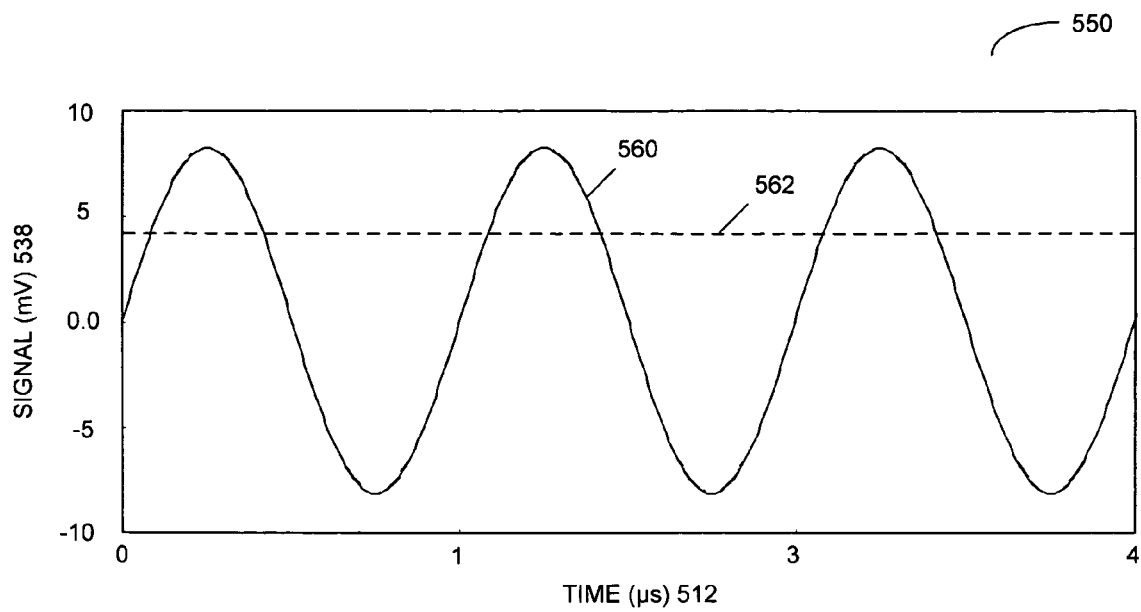
FIG. 5C is a block diagram illustrating a simulated demodulated signal and a simulated DC component in accordance with an embodiment of the present invention.

We now discuss simulations that demonstrate this technique for determining capacitance. In the simulations, each proximity connector is 81 $\mu m^2$ with a maximum coupling capacitance of 1.0 fF. $C_1$ is 1.0 fF, $C_2$ is 0.9 fF (a difference of 0.1 fF), and $C_p$ is 10 fF (including parasitic proximity connector capacitance of 6 fF and amplifier input capacitance of 4 fF). FIGS. 5A-5C provide block diagrams illustrating simulated signal (V) 510 or simulated signal (mV) 538 as a function of time ($\mu s$) 512 at various stages in the circuit in accordance with embodiments 500, 530, and 550 of the present invention. Embodiment 500 illustrates sinusoidal signals 514 with a frequency of 1 MHz, which are examples of the time-varying signals $V_T(t)$ 418-1 and $-V_T(t)$ 418-2. Embodiment 530 illustrates received signal $V_R(t)$ 540. And embodiment 550 illustrates demodulated signal 560 and DC component 562. In this example, the DC component 562 is 4.2 mV. In other embodiments, such as those that use square-wave signals for the time-varying signals $V_T(t)$ 418-1 and $-V_T(t)$ 418-2, the frequency spectrum of the received signal is more complicated. However, the operational principle of the circuit still applies.

Since this measurement technique does not measure small currents, such as $I_{out}$ 314 (FIG. 3), it is insensitive to transistor leakage current. Indeed, even if there is a large leakage path, its effect is to introduce a DC voltage offset. However, the modulator 422 eliminates such DC offsets in embodiments where the modulation signal $V_M(t)$ 424 is sinusoidal.

To see this, suppose that the buffer 420 has an offset that results in a DC shift $V_o$ at its output. Then, the input to the modulator 422 is $$V_R(t)+V_o=C_d\sin(\omega t)+V_o$$

and the demodulated signal is $$V_M(t) \cdot V_R(t) = C_d\sin^2(\omega t) + V_o\sin(\omega t) = \frac{C_d}{2} - \frac{C_d}{2}\cos(2\omega t) + V_o\sin(\omega t).$$

This is the same as Eqn. 1 except for the addition of the AC term $V_o \sin(\omega t)$. Upon passing through the filter 426, this sinusoid is also filtered out, and the output $V_{out}$ 428 (and the measurement accuracy) is unchanged.

In addition, the modulator 422 rejects noise that is uncorrelated with the received signal $V_R(t)$. Thus, noise that occupies any part of the frequency band away from the signal frequency (i.e., the fundamental frequency), for example, is rejected when the received signal $V_R(T)$ is demodulated to DC.

The capacitance measurement technique has a high sensitivity to the difference in capacitance $\Delta C$ (which is defined as $C_1$-$C_2$) and therefore allows for high measurement accuracy. Taking $C_1$ as a constant and expressing $C_2$ as $C_1$-$\Delta C$, then $V_{out}$ 428 is $$V_{out} = \frac{1}{2}\left(\frac{\Delta C}{2C_1 + C_p - \Delta C}\right)$$

and the sensitivity to $\Delta C$ is $$\frac{dV_{out}}{d\Delta C} = \frac{1}{2}\left(\frac{2C_1 + C_p}{[2C_1 + C_p - \Delta C]^2}\right).$$

Figure 6:
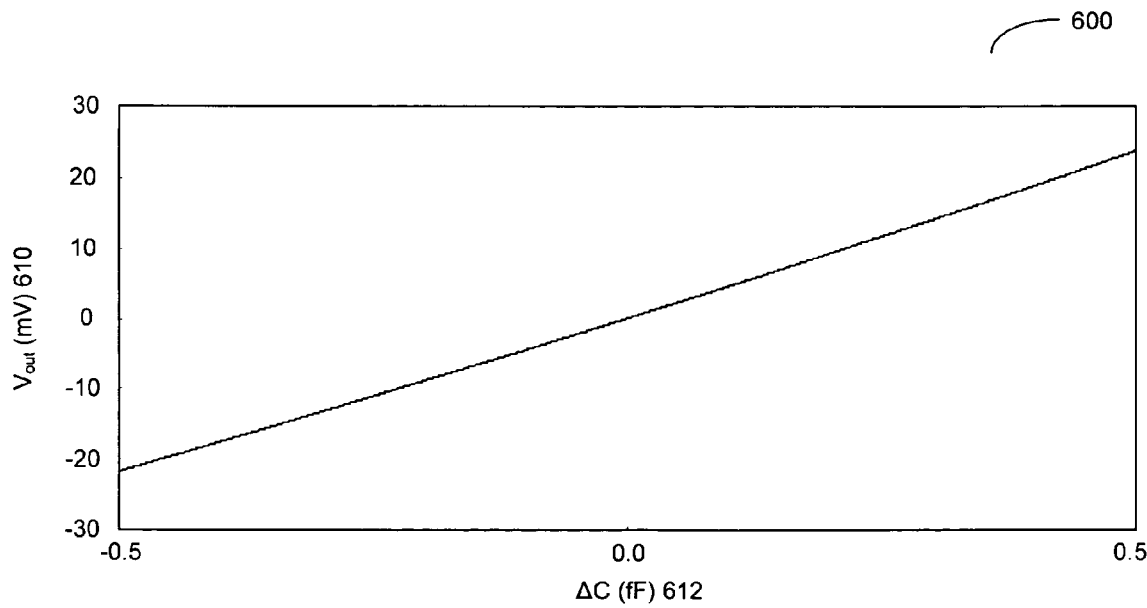
FIG. 6 is a block diagram illustrating a simulated output voltage as a function of capacitance difference in accordance with an embodiment of the present invention.
Figure 7:
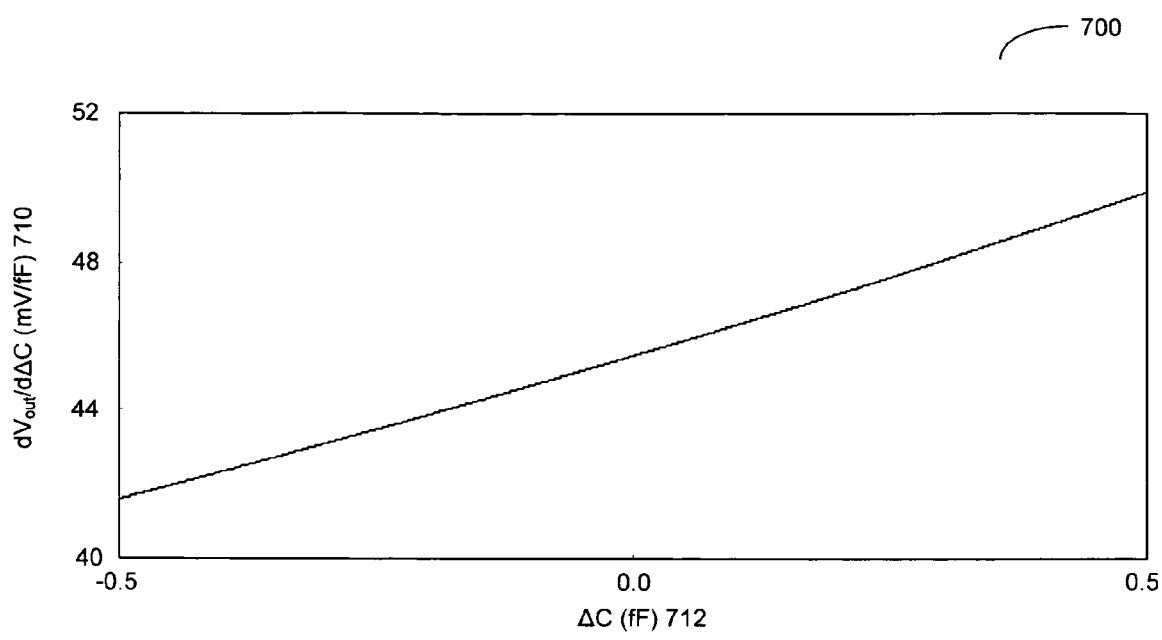
FIG. 7 is a block diagram illustrating a simulated sensitivity as a function of capacitance difference in accordance with an embodiment of the present invention.

FIG. 6 provides a block diagram illustrating a simulated output $V_{out}$ (mV) 610 as a function of capacitance difference $\Delta C$ (fF) 612 in accordance with an embodiment 600 of the present invention, and FIG. 7 provides a block diagram illustrating a simulated sensitivity $dV_{out}/d \Delta C$ 710 as a function of capacitance difference $\Delta C$ (fF) 712 in accordance with an embodiment 700 of the present invention. In these simulations, an amplitude of the time-varying signals 418 is 1 V, $C_1$=0.5 fF, and $C_p$=10 fF. Note that the simulated sensitivity $dV_{out}/d \Delta C$ 710 is about 45 mV/fF for $\Delta C$=0 fF.

Figure 8:
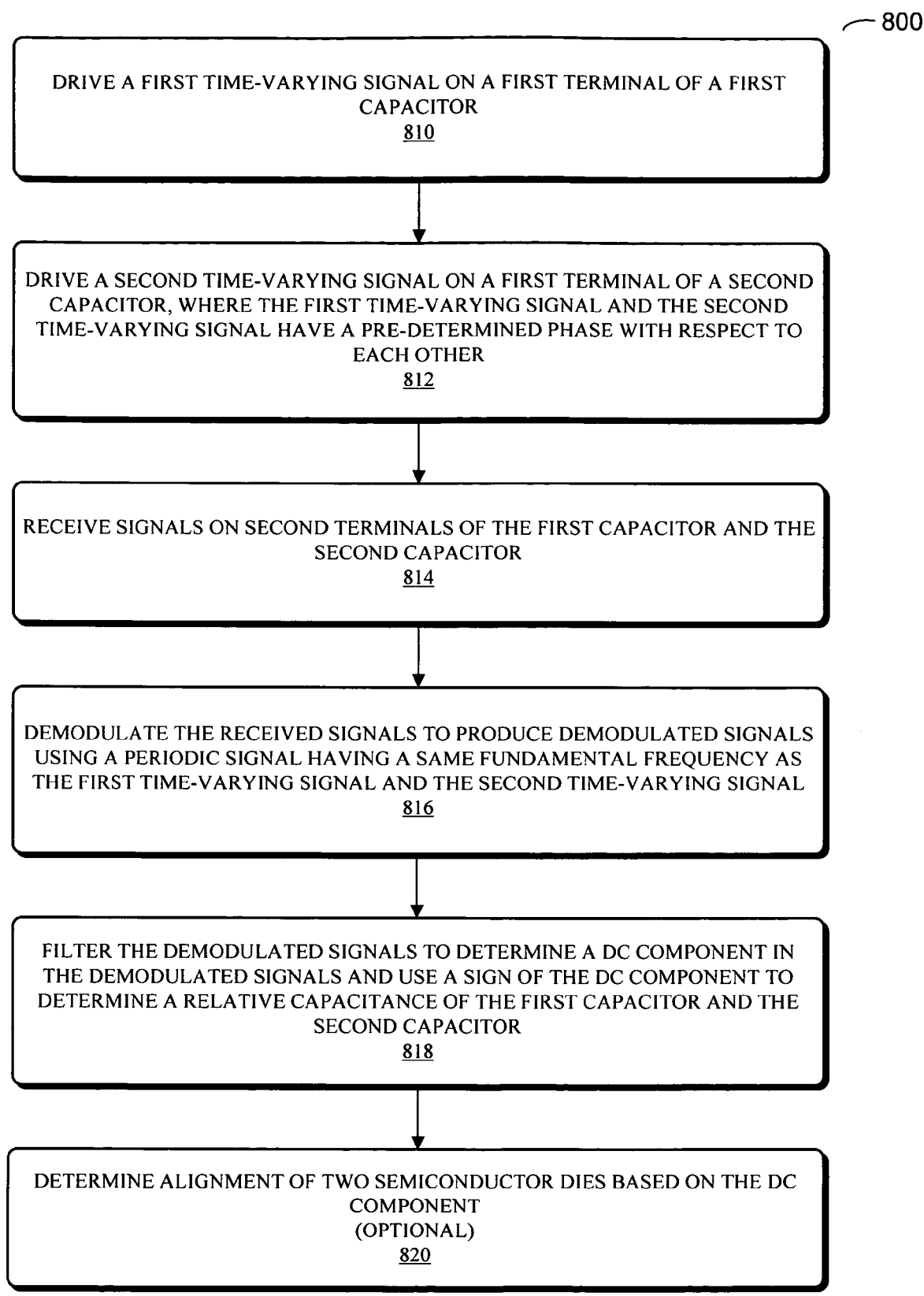
FIG. 8 is a flow chart illustrating a process for determining capacitance in accordance with an embodiment of the present invention.

We now discuss methods for determining capacitance. FIG. 8 is a flow chart illustrating a process for determining capacitance in accordance with an embodiment 800 of the present invention. During this process, a first time-varying signal is driven on a first terminal of a first capacitor (810) and a second time-varying signal is driven on a first terminal of a second capacitor (812). Furthermore, the first time-varying signal and the second time-varying signal have a pre-determined phase with respect to each other. Signals are then received on second terminals of the first capacitor and the second capacitor (814). These received signals are demodulated to produce demodulated signals using a periodic signal having a same fundamental frequency as a fundamental frequency of the first time-varying signal and the second time-varying signal (816). The demodulated signals are filtered to determine a DC component in the demodulated signals, where a sign of the DC component determines a relative capacitance of the first capacitor and the second capacitor (818). More over, alignment of two semiconductor dies is optionally determined based on the DC component (820). In some embodiments, there may be additional or fewer operations, the order of the operations may be changed, and two or more operations may be combined into a single operation.

As discussed previously, the technique for determining capacitance may also be used to determine misalignment between two semiconductor dies. However, in embodiments where relative capacitance is determined it may not be possible to determine misalignment is all six degrees of freedom. In particular, it may be more complicated to determine separation and tilt using these techniques. Nonetheless, measurements of in-plane misalignment and in-plane rotation may be simplified. For example, to determine in-plane misalignment one row (or column) of proximity connectors in an array on the transmitting semiconductor die may be activated, and the row (or column) that has the highest signal on the receiving semiconductor die may be determined. In this case, only the relative coupling between one row (or column) and any other row (or column) is of interest.

One approach to addressing this challenge in determining the misalignment in all six degrees of freedom is to combine the capacitance measurement technique described above with another technique, such as one based on measurement of the average current using a switched rectifier circuit. The latter technique may be used to determine the separation and tilt. For example, if a switchable array of proximity connectors is not used for these measurements, the impact of leakage is minimal. And the demodulation technique for determining capacitance may be used in conjunction with a switchable array of proximity connectors to determine the other degrees of misalignment.

Figure 9:
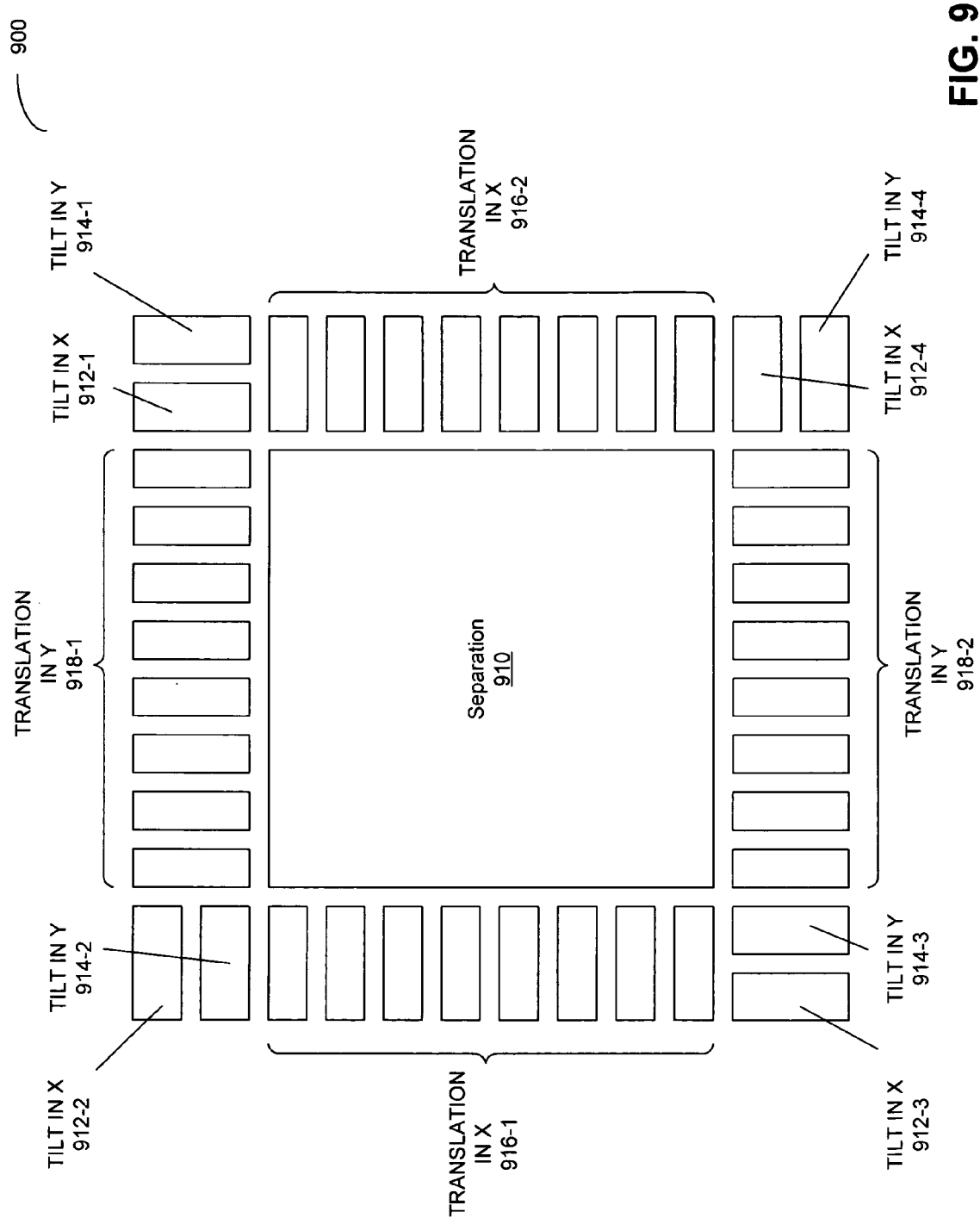
FIG. 9 is a block diagram illustrating an array of proximity connectors in accordance with an embodiment of the present invention.

FIG. 9 provides a block diagram illustrating such an array of proximity connectors in accordance with an embodiment 900 of the present invention. Dedicated proximity connectors 910, 912, and 914 are used in conjunction with a rectifier-based measurement technique to measure separation, tilt in X (i.e., in the second plane), and tilt in Y (i.e., in the third plane). To measure in-plane translations, i.e., translations in X and/or translations in Y, Vernier structures of proximity connectors 916 and 918 and the demodulation measurement technique are used. To measure in-plane rotations, in-plane misalignment or translations may be measured at two different locations. In the absence of rotation, misalignment should be the same at both locations (i.e., $x_1=x_2$ and $y_1=y_2$). Thus, angles of rotation may be determined by measuring any differences in alignment (i.e., $x_2-x_1$ and $y_2-y_1$).

Figure 10:
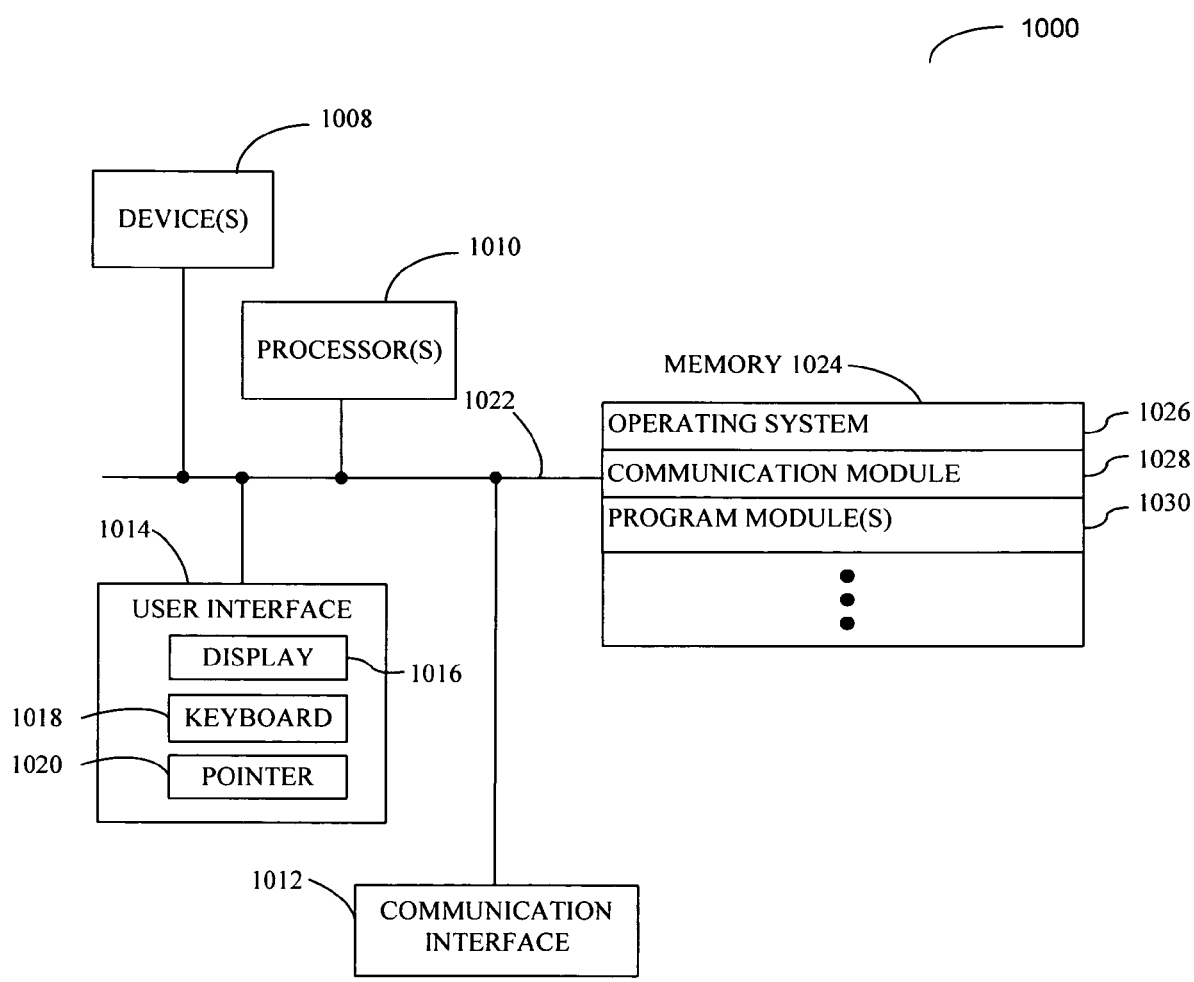
FIG. 10 is a block diagram illustrating a computer system in accordance with an embodiment of the present invention.

The present invention may include systems that contain one or more devices that include components (such as one or more semiconductor dies) that communicate signals using capacitively coupled proximity connectors. For example, FIG. 10 presents a block diagram illustrating a computer system 1000 in accordance with an embodiment of the present invention, which includes one or more processors 1010, a communication interface 1012, a user interface 1014, and one or more signal lines 1022 coupling these components together. Note that the one or more processing units 1010 may support parallel processing and/or multi-threaded operation, the communication interface 1012 may have a persistent communication connection, and the one or more signal lines 1022 may constitute a communication bus. Moreover, the user interface 1014 may include a display 1016, a keyboard 1018, and/or a pointer, such as a mouse 1020.

The computer system 1000 may include memory 1024, which may include high speed random access memory and/or non-volatile memory. More specifically, memory 1024 may include ROM, RAM, EPROM, EEPROM, FLASH, one or more smart cards, one or more magnetic disc storage devices, and/or one or more optical storage devices. Memory 1024 may store an operating system 1026, such as SOLARIS, LINUX, UNIX, MACINTOSH, or WINDOWS, that includes procedures (or a set of instructions) for handling various basic system services for performing hardware dependent tasks. The memory 1024 may also store procedures (or a set of instructions) in a communication module 1028. The communication procedures may be used for communicating with one or more computers and/or servers, including computers and/or servers that are remotely located with respect to the computer system 1000.

Memory 1024 may also include the one or more program modules (of sets of instructions) 1030. Instructions in the program modules 1030 in the memory 1024 may be implemented in a high-level procedural language, an object-oriented programming language, and/or in an assembly or machine language. The programming language may be compiled or interpreted, i.e, configurable or configured to be executed by the one or more processing units 1010.

The computer system 1000 may include one or more devices 1008 that include semiconductor dies that communication using proximity communication as described in the previous embodiments. Coupling capacitance and/or misalignment between at least some of these semiconductor dies may be determined using the capacitance measurement technique described above.

The computer system 1000 may include fewer components or additional components, two or more components may be combined into a single component, and/or a position of one or more components may be changed. In some embodiments, the functionality of the computer system 1000 may be implemented more in hardware and less in software, or less in hardware and more in software, as is known in the art.

Although the computer system 1000 is illustrated as having a number of discrete items, FIG. 10 is intended to be a functional description of the various features that may be present in the computer system 1000 rather than as a structural schematic of the embodiments described herein. In practice, and as recognized by those of ordinary skill in the art, the functions of the computer system 1000 may be distributed over a large number of servers or computers, with various groups of the servers or computers performing particular subsets of the functions. In some embodiments, some or all of the functionality of the computer system 1000 may be implemented in one or more ASICs and/or one or more digital signal processors DSPs.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for determining capacitance, comprising:
   driving a first time-varying signal on a first terminal of a first capacitor;
   driving a second time-varying signal on a first terminal of a second capacitor, wherein the first time-varying signal and the second time-varying signal have a pre-determined phase relationship with each other;
   receiving signals on second terminals of the first capacitor and the second capacitor;
   demodulating the received signals to produce demodulated signals using a periodic signal having a same fundamental frequency as a fundamental frequency of the first time-varying signal and the second time-varying signal;
   filtering the demodulated signals to determine a DC component in the demodulated signals, and
   using a sign of the DC component to determine a relative capacitance of the first capacitor and the second capacitor.

2. The method of claim 1, further comprising isolating the received signals using a unity gain buffer.

3. The method of claim 1, further comprising amplifying the received signals using a differential amplifier.

4. The method of claim 3, further comprising biasing inputs to the differential amplifier to set a DC level of these inputs.

5. The method of claim 1, wherein the second terminals of the first capacitor and the second capacitor are a common terminal that is common to both capacitors.

6. The method of claim 5, wherein the first capacitor and the second capacitor correspond to proximity connectors that are proximate to surfaces of two semiconductor dies that are configured to communicate signals via capacitive coupling, and wherein the first terminals of the first capacitor and the second capacitor are located on one of the two semiconductor dies and the common terminal of the first capacitor and the second capacitor is located on the other of the two semiconductor dies.

7. The method of claim 6, further comprising determining alignment of the two semiconductor dies based on the DC component.

8. The method of claim 1, wherein the second capacitor is a varactor.

9. The method of claim 1, wherein the pre-determined relationship phase is approximately 180°.

10. The method of claim 1, further comprising determining a phase of the periodic signal such that the DC component is approximately 0 when the first capacitor and the second capacitor have approximately equal capacitance.

11. The method of claim 1, further comprising:
    sequentially driving time-varying signals on first terminals of a set of capacitors;
    selectively coupling to second terminals of the set of capacitors; and
    receiving signals on a second terminal of the first capacitor and a second terminal of at least one of the set of capacitors in order to determine a capacitance of the first capacitor using a binary search procedure.

12. A device containing a first semiconductor die, the first semiconductor die comprising:
    proximity connectors in a first array proximate to a surface of the first semiconductor die; and
    a buffer circuit coupled to at least a first proximity connector in the first array, wherein the buffer circuit is configured to receive signals on at least the first proximity connector;

a demodulator circuit coupled to the buffer circuit, wherein the demodulator circuit is configured to demodulate the received signals to produce demodulated signals using a periodic signal having a same fundamental frequency as a fundamental frequency of the received signals; and a filter coupled to the demodulator circuit, wherein the filter is configured to determine a DC component in the demodulated signals;

wherein the received signals are capacitively coupled between the semiconductor die and another semiconductor die via two capacitors corresponding to at least the first proximity connector and proximity connectors on the other semiconductor die, and wherein a sign of the DC component determines a relative capacitance of the two capacitors.

13. The device of claim 12, further containing a second semiconductor die, the second semiconductor die comprising:

proximity connectors in a second array proximate to a surface of the second semiconductor die; and a drive circuit coupled to a second proximity connector and a third proximity connector in the second array, wherein the drive circuit is configured to drive a first time-varying signal on the second proximity connector and a second time-varying signal on the third proximity connector, the first time-varying signal and the second time-varying signal having a pre-determined phase relationship with each other, and wherein alignment of the first semiconductor die and the second semiconductor die is determined based on the DC component.

14. The device of claim 13, wherein the pre-determined phase relationship is approximately 180°.

15. The device of claim 14, wherein the first semiconductor die further includes a first selection circuit configured to selectively couple the buffer circuit to proximity connectors in the first array, and wherein the second semiconductor die further includes a second selection circuit configured to selectively couple the drive circuit to proximity connectors in the second array.

16. The device of claim 15, wherein at least one of the first semiconductor die and the second semiconductor die includes control logic configured to control selective coupling of the buffer circuit to proximity connectors in the first array and the drive circuit to proximity connectors in the second array in order to determine a capacitance of at least one of the two capacitors using a binary search procedure.

17. The device of claim 13, buffer circuit has unity gain.

18. The device of claim 13, buffer circuit includes a differential amplifier.

19. The device of claim 18, wherein the buffer circuit is further coupled to a second proximity connector in the first array, the buffer circuit is further configured to receive signals on the second proximity connector, and wherein the two capacitors correspond to the first proximity connector, the second proximity connector, and proximity connectors on the other semiconductor die.

20. The device of claim 13, further comprising a calibration circuit coupled to the demodulator circuit, wherein the calibration circuit is configured to determine the phase of the periodic signal such that the DC component is approximately 0 when the two capacitors have approximately equal capacitance.

* * * * *